(12) United States Patent
Hwang et al.

(10) Patent No.: US 11,029,596 B2
(45) Date of Patent: *Jun. 8, 2021

(54) FILM MASK, METHOD FOR MANUFACTURING SAME, AND METHOD FOR FORMING PATTERN USING FILM MASK AND PATTERN FORMED THEREBY

(71) Applicant: LG CHEM, LTD., Seoul (KR)

(72) Inventors: Ji Young Hwang, Daejeon (KR); Han Min Seo, Daejeon (KR); Nam Seok Bae, Daejeon (KR); Seung Heon Lee, Daejeon (KR); Dong Hyun Oh, Daejeon (KR); Jungsun You, Daejeon (KR)

(73) Assignee: LG CHEM, LTD., Seoul (KR)

( * ) Notice: Subject to any disclaimer, the term of this patent is extended or adjusted under 35 U.S.C. 154(b) by 205 days.

This patent is subject to a terminal disclaimer.

(21) Appl. No.: 15/776,759

(22) PCT Filed: Jan. 31, 2017

(86) PCT No.: PCT/KR2017/001031
§ 371 (c)(1),
(2) Date: May 16, 2018

(87) PCT Pub. No.: WO2017/131498
PCT Pub. Date: Aug. 3, 2017

(65) Prior Publication Data
US 2018/0348627 A1   Dec. 6, 2018

(30) Foreign Application Priority Data
Jan. 27, 2016   (KR) .................. 10-2016-0010240

(51) Int. Cl.
*G03F 1/48*    (2012.01)
*G03F 1/76*    (2012.01)
(Continued)

(52) U.S. Cl.
CPC .................. *G03F 1/76* (2013.01); *G03F 1/38* (2013.01); *G03F 1/48* (2013.01); *G03F 7/0002* (2013.01);
(Continued)

(58) Field of Classification Search
CPC . G03F 7/0002; G03F 7/20; G03F 7/30; G03F 7/70791; G03F 1/48; G03F 1/76; G03F 1/38; H01L 21/033
See application file for complete search history.

(56) References Cited

U.S. PATENT DOCUMENTS

| | | |
|---|---|---|
| 4,166,148 A | 8/1979 | Sakurai |
| 4,581,308 A | 4/1986 | Moriya et al. |

(Continued)

FOREIGN PATENT DOCUMENTS

| | | |
|---|---|---|
| CN | 1595294 | 3/2005 |
| CN | 104937697 | 9/2015 |

(Continued)

OTHER PUBLICATIONS

Machine translation of JP 08-099359 (1996).*

(Continued)

*Primary Examiner* — Martin J Angebrannt
(74) *Attorney, Agent, or Firm* — Dentons US LLP

(57) ABSTRACT

The present application relates to a film mask comprising: a transparent substrate; a darkened light-shielding pattern layer provided on the transparent substrate; and an embossed pattern part provided on a surface of the transparent substrate, which is provided with the darkened light-shielding pattern layer, a method for manufacturing the same, a method for forming a pattern by using the same, and a pattern formed by using the same.

11 Claims, 8 Drawing Sheets

(51) Int. Cl.
  *G03F 1/38* (2012.01)
  *G03F 7/00* (2006.01)
  *G03F 7/20* (2006.01)
  *G03F 7/30* (2006.01)
  *H01L 21/033* (2006.01)

(52) U.S. Cl.
  CPC ............ *G03F 7/20* (2013.01); *G03F 7/70791* (2013.01); *H01L 21/033* (2013.01); *G03F 7/30* (2013.01)

(56) References Cited

U.S. PATENT DOCUMENTS

| | | |
|---|---|---|
| 4,735,890 A | 4/1988 | Nakane |
| 4,752,498 A * | 6/1988 | Fudim .................. B01J 19/121 118/620 |
| 5,079,113 A | 1/1992 | Ohta et al. |
| 5,318,868 A | 6/1994 | Hasegawa et al. |
| 5,718,991 A | 2/1998 | Lin et al. |
| 5,888,674 A | 3/1999 | Yang et al. |
| 6,030,729 A | 2/2000 | Ito et al. |
| 7,561,332 B2 | 7/2009 | Little et al. |
| 7,604,906 B1 | 10/2009 | Volk et al. |
| 7,955,545 B2 | 6/2011 | Lee et al. |
| 8,177,991 B2 | 5/2012 | Lussem et al. |
| 8,894,871 B2 | 11/2014 | Shin et al. |
| 2001/0031426 A1 | 10/2001 | Mancini et al. |
| 2001/0035821 A1 | 11/2001 | Ruhrig et al. |
| 2002/0036460 A1 | 3/2002 | Takenaka et al. |
| 2002/0182515 A1 | 12/2002 | Hung |
| 2003/0091908 A1 | 5/2003 | Takayanagi |
| 2003/0138704 A1 | 7/2003 | Mei et al. |
| 2003/0175154 A1 | 9/2003 | Hsu et al. |
| 2003/0175427 A1 | 9/2003 | Loo et al. |
| 2003/0232179 A1 | 12/2003 | Steenblik et al. |
| 2004/0023162 A1 | 2/2004 | Hasegawa et al. |
| 2004/0123895 A1 | 7/2004 | Kardauskas et al. |
| 2005/0042553 A1 | 2/2005 | Lu et al. |
| 2005/0170621 A1 | 8/2005 | Kim et al. |
| 2005/0227497 A1 | 10/2005 | Padovani |
| 2005/0250276 A1 | 11/2005 | Heath et al. |
| 2006/0056024 A1 | 3/2006 | Ahn et al. |
| 2006/0113279 A1 | 6/2006 | Little |
| 2006/0118514 A1 | 6/2006 | Little et al. |
| 2006/0267029 A1 | 11/2006 | Li |
| 2007/0183035 A1 | 8/2007 | Asakawa et al. |
| 2007/0264481 A1 * | 11/2007 | DeSimone ............ A61K 9/5138 428/220 |
| 2008/0041816 A1 | 2/2008 | Choo |
| 2008/0107973 A1 * | 5/2008 | Hattori .................. B82Y 10/00 430/5 |
| 2008/0241491 A1 | 10/2008 | Wessels et al. |
| 2008/0266502 A1 * | 10/2008 | Chiu ....................... C30B 25/18 349/124 |
| 2008/0305410 A1 * | 12/2008 | Bae ....................... G03F 7/0002 430/5 |
| 2009/0162799 A1 | 6/2009 | Porque |
| 2009/0219617 A1 | 9/2009 | Asakawa et al. |
| 2010/0072675 A1 * | 3/2010 | Cho ...................... G03F 7/0002 264/496 |
| 2010/0080914 A1 | 4/2010 | Forrest et al. |
| 2010/0320742 A1 | 12/2010 | Hoffmuller et al. |
| 2012/0015288 A1 | 1/2012 | Ikeda et al. |
| 2012/0021139 A1 | 1/2012 | Chang et al. |
| 2012/0287362 A1 * | 11/2012 | Hashimura ............ B82Y 20/00 349/15 |
| 2012/0295435 A1 | 11/2012 | Yoneda |
| 2013/0167355 A1 | 7/2013 | Lutz et al. |
| 2013/0270223 A1 | 10/2013 | Lee et al. |
| 2013/0314685 A1 | 11/2013 | Shin |
| 2014/0120199 A1 | 5/2014 | Terasaki et al. |
| 2015/0010766 A1 | 1/2015 | Hwang et al. |
| 2015/0064628 A1 | 3/2015 | Guo |
| 2015/0079341 A1 * | 3/2015 | Tazaki .................. B29C 59/046 428/141 |
| 2015/0118603 A1 | 4/2015 | Hong et al. |
| 2015/0309417 A1 | 10/2015 | Park et al. |
| 2015/0368453 A1 | 12/2015 | Wada et al. |
| 2015/0378252 A1 | 12/2015 | Lee et al. |
| 2017/0075051 A1 | 3/2017 | Jeong et al. |
| 2017/0133639 A1 | 5/2017 | Yu |
| 2017/0157836 A1 * | 6/2017 | Miyazawa ............. B29C 33/40 |
| 2017/0203330 A1 * | 7/2017 | Miyazawa ................. B41J 2/01 |
| 2018/0329286 A1 * | 11/2018 | Hwang .................... G03F 7/20 |
| 2018/0341176 A1 | 11/2018 | Hwang et al. |
| 2018/0348627 A1 | 12/2018 | Hwang et al. |

FOREIGN PATENT DOCUMENTS

| | | |
|---|---|---|
| CN | 105118844 | 12/2015 |
| DE | 10-2007-049315 | 4/2009 |
| EP | 3410214 | 12/2018 |
| JP | S50-57425 | 5/1975 |
| JP | S53-23277 | 3/1978 |
| JP | 553-68578 | 6/1978 |
| JP | 53-123467 | * 10/1978 |
| JP | S54-71987 | 6/1979 |
| JP | 54-141573 | * 11/1979 |
| JP | S55-904 | 1/1980 |
| JP | S56-64343 | 6/1981 |
| JP | S57-46243 | 3/1982 |
| JP | S57-124436 | 8/1982 |
| JP | S58-58546 | 4/1983 |
| JP | S59-84245 | 5/1984 |
| JP | S59-143157 | 8/1984 |
| JP | S60-43660 | 3/1985 |
| JP | 60-240737 | * 11/1985 |
| JP | S61-196245 | 8/1986 |
| JP | S62-5244 | 1/1987 |
| JP | 62-035361 | * 2/1987 |
| JP | S62-35361 | 2/1987 |
| JP | S62-40458 | 2/1987 |
| JP | S62-67546 | 3/1987 |
| JP | S62-85251 | 4/1987 |
| JP | H01-166046 | 6/1989 |
| JP | 01-171528 | * 7/1989 |
| JP | 01-241120 | * 9/1989 |
| JP | H02-93537 | 4/1990 |
| JP | H03-20733 | 1/1991 |
| JP | H03-129346 | 6/1991 |
| JP | H04-93948 | 3/1992 |
| JP | H04-269749 | 9/1992 |
| JP | H04-294193 | 10/1992 |
| JP | H04-298382 | 10/1992 |
| JP | H05-34896 | 2/1993 |
| JP | 05-200757 | * 8/1993 |
| JP | H05-265196 | 10/1993 |
| JP | H06-120124 | 4/1994 |
| JP | H06-250378 | 9/1994 |
| JP | 07-174911 | * 7/1995 |
| JP | 08-021746 | * 1/1996 |
| JP | 08-099359 | * 4/1996 |
| JP | 10-051082 | * 2/1998 |
| JP | H10-51183 | 2/1998 |
| JP | 2002-062638 | 2/2002 |
| JP | 2003-107677 | 4/2003 |
| JP | 2003-195472 | 7/2003 |
| JP | 2003-279949 | 10/2003 |
| JP | 2003-295428 | 10/2003 |
| JP | 2004-304097 | 10/2004 |
| JP | 2005-056981 | 3/2005 |
| JP | 2005-062545 | * 3/2005 |
| JP | 2005-215624 | 8/2005 |
| JP | 2006-011211 | 1/2006 |
| JP | 2006-084776 | 3/2006 |
| JP | 2006-324369 | * 11/2006 |
| JP | 2006-327182 | 12/2006 |
| JP | 2007-103915 | 4/2007 |
| JP | 2007-128083 | 5/2007 |
| JP | 2007-150053 | 6/2007 |
| JP | 2007-165679 | 6/2007 |
| JP | 2008-046580 | 2/2008 |

(56) References Cited

FOREIGN PATENT DOCUMENTS

| | | |
|---|---|---|
| JP | 2008-074043 | 4/2008 |
| JP | 2008-090238 | 4/2008 |
| JP | 2008-522226 | 6/2008 |
| JP | 2008-241987 | 10/2008 |
| JP | 2008-242293 | 10/2008 |
| JP | 2008-299178 | 12/2008 |
| JP | 2008-311416 | 12/2008 |
| JP | 2009-092840 | 4/2009 |
| JP | 2009-093084 | 4/2009 |
| JP | 2009-105252 | 5/2009 |
| JP | 2009-145742 | 7/2009 |
| JP | 2009-188237 | 8/2009 |
| JP | 2010060681 | 3/2010 |
| JP | 2010-158805 | 7/2010 |
| JP | 2010-237542 | 10/2010 |
| JP | 2011-028174 | 2/2011 |
| JP | 2011-029248 | 2/2011 |
| JP | 2011-062879 | 3/2011 |
| JP | 2011-133750 | 7/2011 |
| JP | 2011-183731 | 9/2011 |
| JP | 2011-242473 | 12/2011 |
| JP | 2012-101474 | 5/2012 |
| JP | 2012-108352 | 6/2012 |
| JP | 2014-096593 | 5/2014 |
| JP | 2015-507214 | 3/2015 |
| JP | 2015-079100 | 4/2015 |
| JP | 2015-159179 | 9/2015 |
| JP | 2018-535446 | 11/2018 |
| JP | 2018-536184 | 12/2018 |
| JP | 2019-502143 | 1/2019 |
| KR | 10-1992-0022424 | 12/1992 |
| KR | 10-0271699 | 12/2000 |
| KR | 10-2004-0043928 | 5/2004 |
| KR | 10-2005-0038243 | 4/2005 |
| KR | 10-2007-0027083 | 3/2007 |
| KR | 10-2009-0003601 | 1/2009 |
| KR | 10-2009-0019200 | 2/2009 |
| KR | 10-2010-0074434 | 7/2010 |
| KR | 10-2011-0107120 | 9/2011 |
| KR | 10-2012-0019241 | 3/2012 |
| KR | 10-2013-0061657 | 6/2013 |
| KR | 10-2013-0091225 | 8/2013 |
| KR | 10-2013-0116978 | 10/2013 |
| KR | 10-2013-0126391 | 11/2013 |
| KR | 10-2015-0004647 | 1/2015 |
| WO | 2016/006592 | 1/2016 |
| WO | 2014-104074 | 1/2017 |

OTHER PUBLICATIONS

Machien translation of JP 54-141573 (1979).*
Kim et al., "Nanolithography based on patterned metal transfer and its application to organic electronic devices," Applied Physics Letters, 80(21): 4051-4053, published May 27, 2002.

* cited by examiner

[Figure 1]
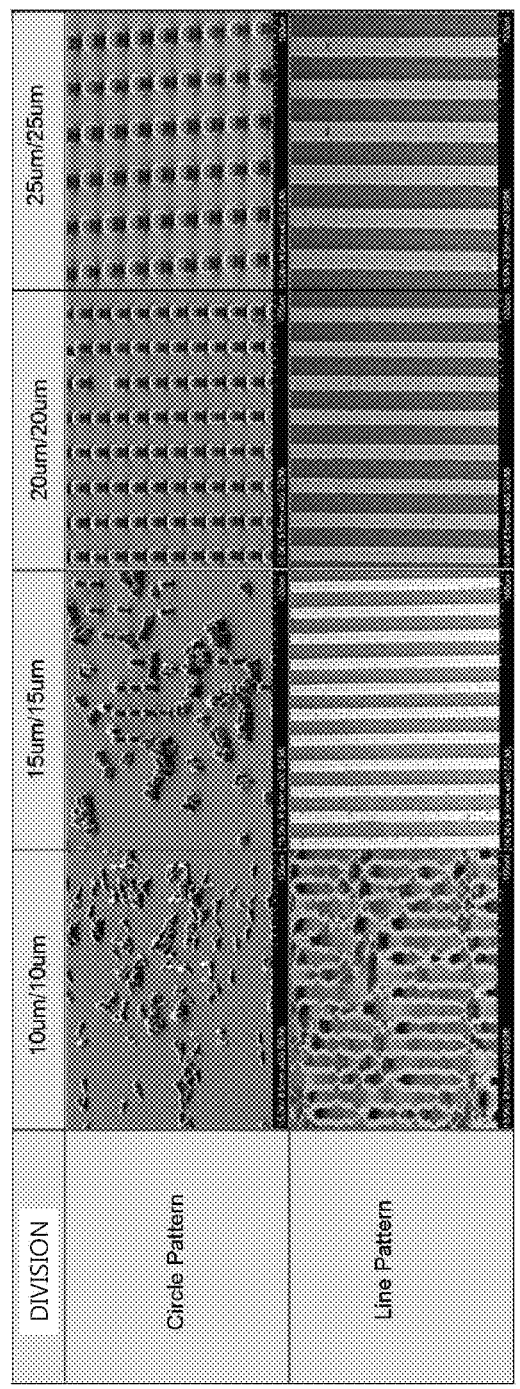

[Figure 2]
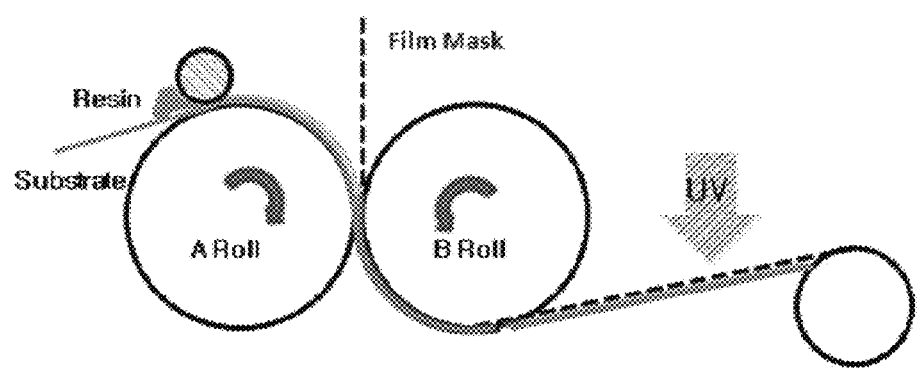
[Figure 3]
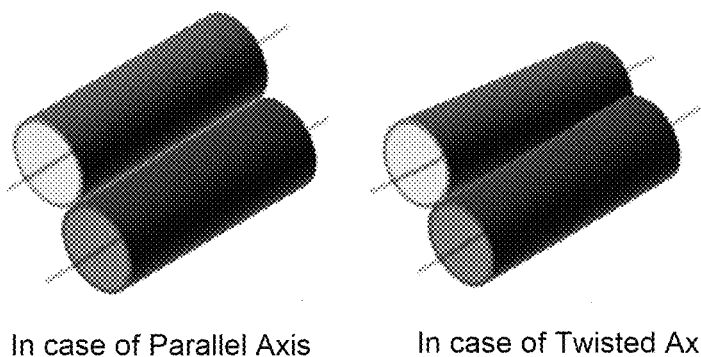
In case of Parallel Axis    In case of Twisted Axis

[Figure 4]
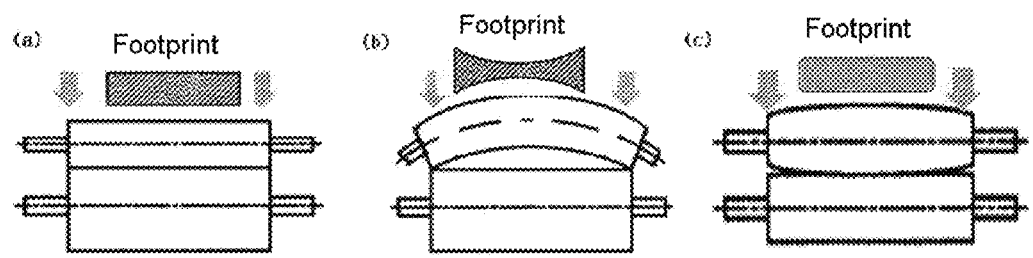

[Figure 5]
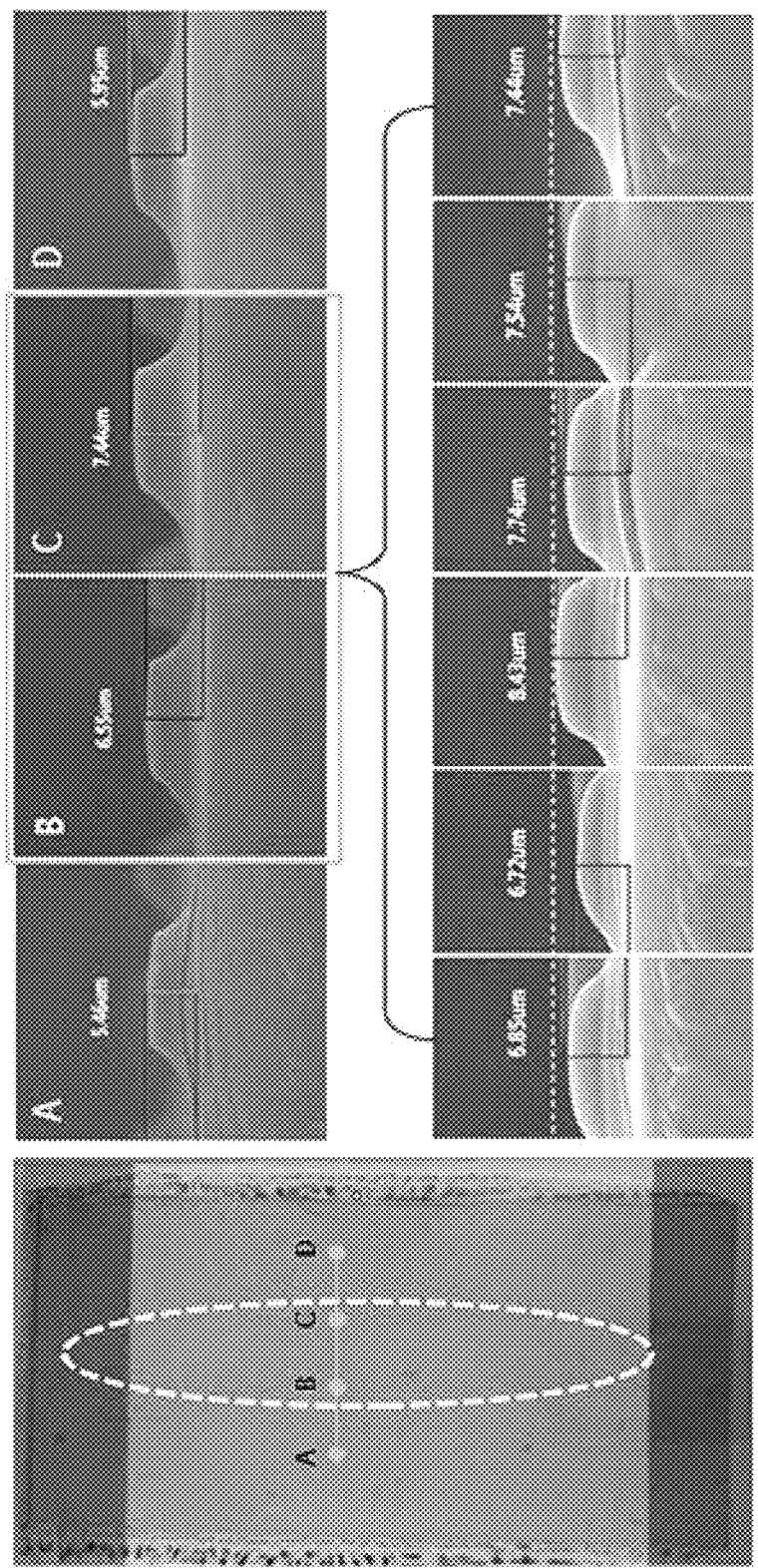

[Figure 6]
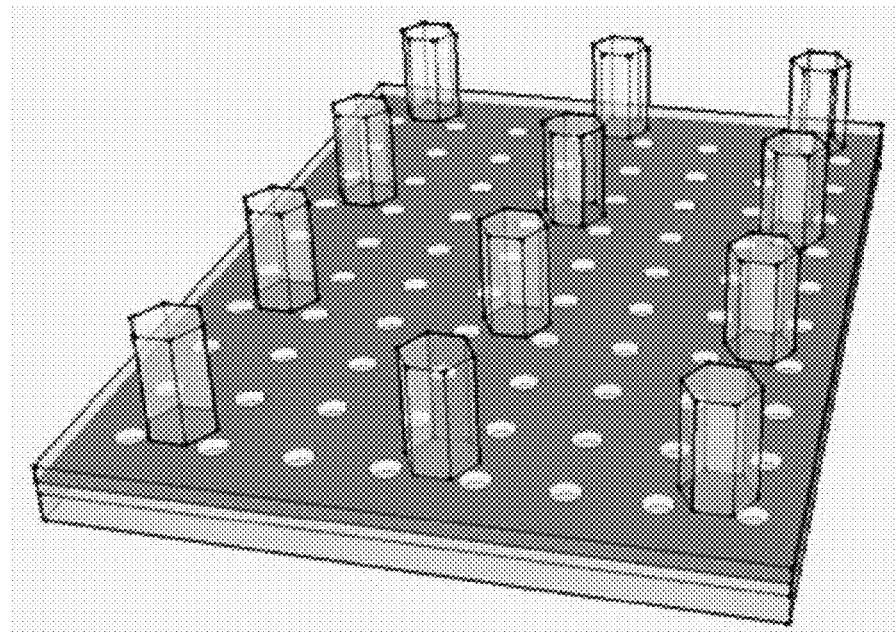
[Figure 7]
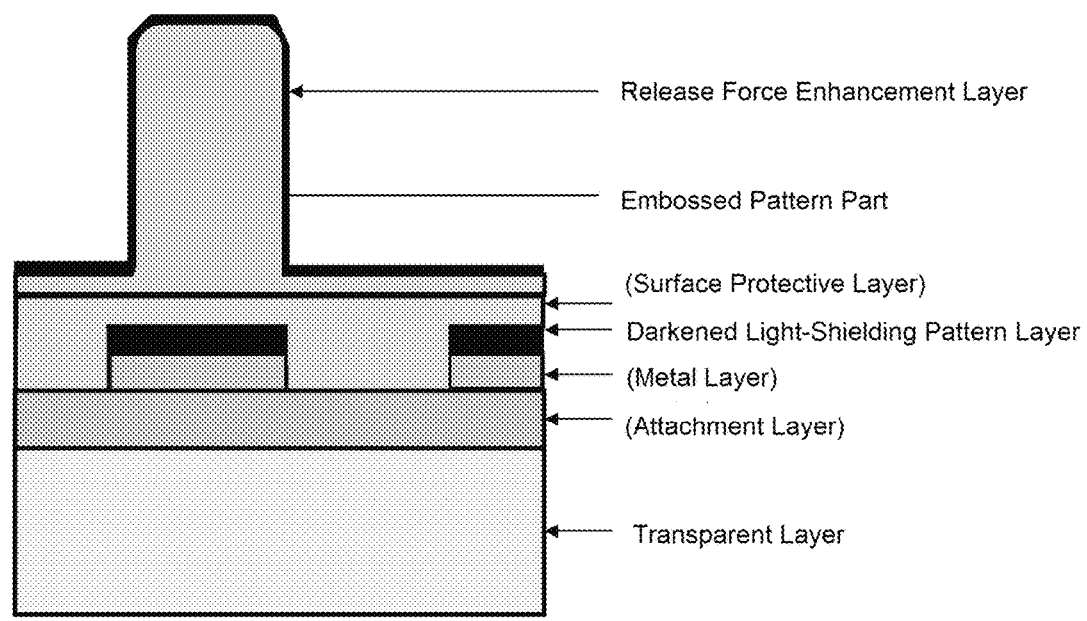

[Figure 8]
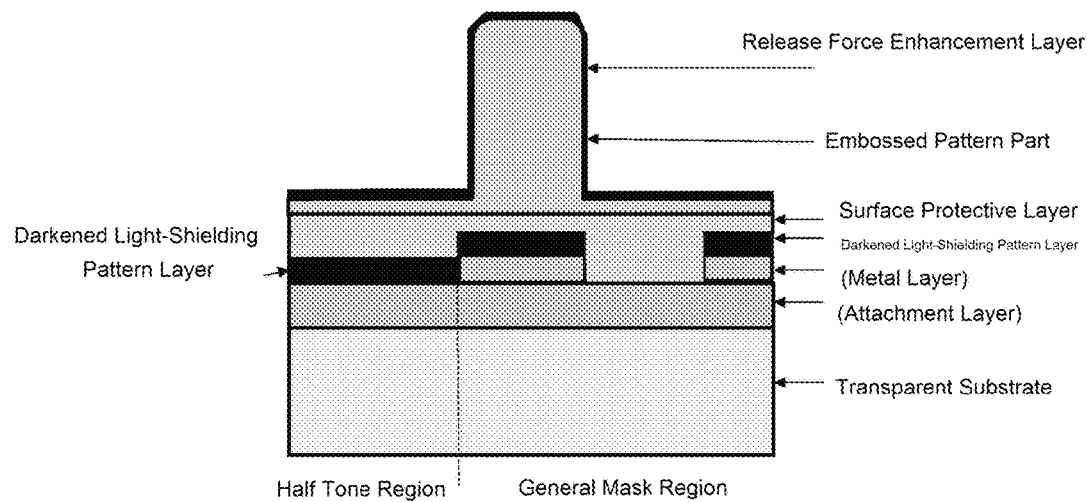
[Figure 9]
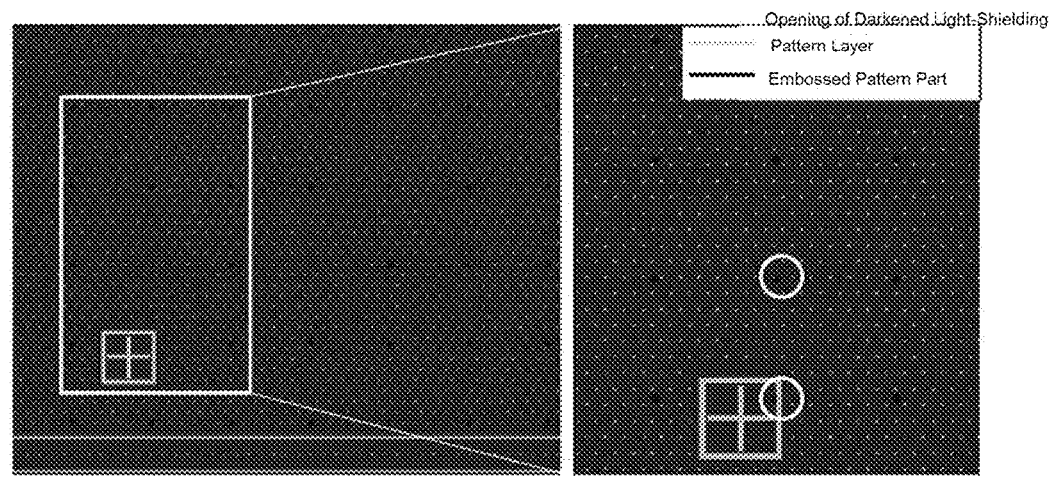

[Figure 10]
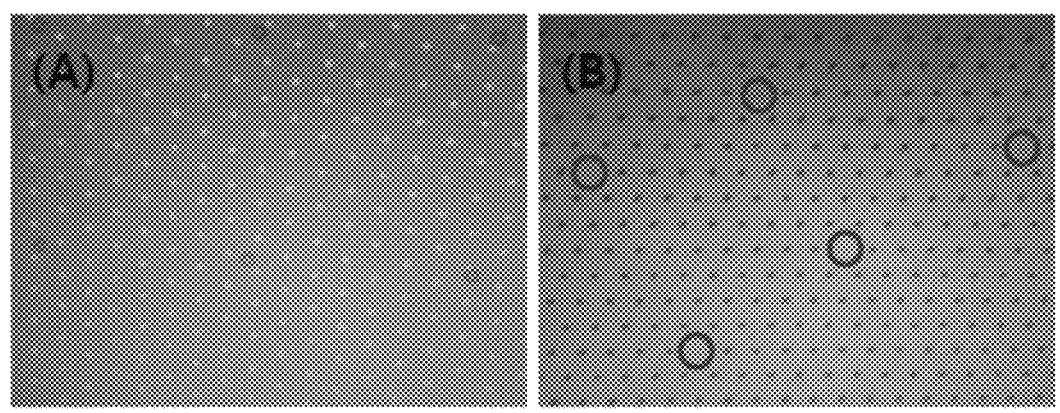

[Figure 11]
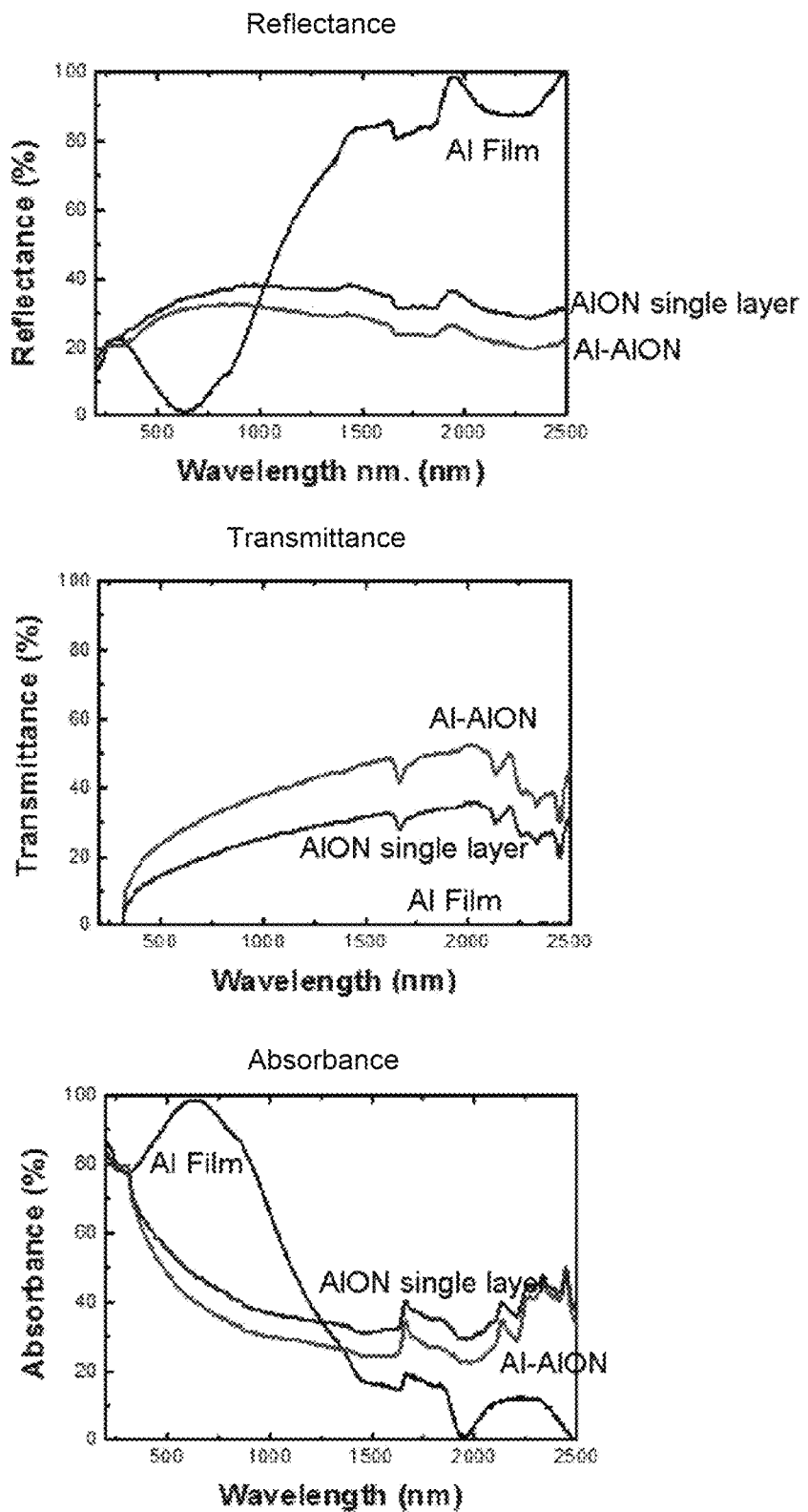

FILM MASK, METHOD FOR MANUFACTURING SAME, AND METHOD FOR FORMING PATTERN USING FILM MASK AND PATTERN FORMED THEREBY

TECHNICAL FIELD

This application is a National Stage Application of International Application No. PCT/KR2017/001031 filed on Jan. 31, 2017, which claims priority to and the benefit of Korean Patent Application No. 10-2016-0010240 filed in the Korean Intellectual Property Office on Jan. 27, 2016, both of which are incorporated herein in their entirety by reference for all purposes as if fully set forth herein.

TECHNICAL FIELD

The present application relates to a film mask, a method for manufacturing the same, and a method for forming a pattern using the film mask and a pattern formed thereby.

BACKGROUND ART

When a general film mask-based roll-to-roll photolithography technology fails to secure adhesive force with a substrate to be patterned, the reduction in resolution of a pattern and the deviation for each position occur. In order to overcome the deviation in patterning for each position, a lamination process is introduced to maximally adhere a film mask in a UV exposed region to a substrate during the pattern process. However, the lamination process has a disadvantage in that it is difficult to maintain an exact tolerance due to characteristics such as a machining tolerance of a nip roll for lamination, generally a tolerance of 3/100 mm or more and deformation resulting from pressure. In order to overcome the disadvantage, a patterning technology using a dry film resist (hereinafter, referred to as DFR) has been recently attempted, and for the technology, a process comprising warming a dry film resist in a film state at room temperature to near about 100° C., laminating the dry film resist on a substrate, laminating a film mask again, and then performing a UV exposure is carried out. However, the dry film resist has difficulties in implementing a high-resolution pattern due to a disadvantage in that it is difficult to overcome a resolution problem of the DFR during an actual patterning along with a disadvantage in that it is difficult to adjust the thickness of the film to a desired thickness. FIG. 1 illustrates problems with an ability to implement a pattern and an attaching force according to resolution during a patterning by using the DFR. Specifically, there is a problem with the attaching force of an isolated pattern sized 15 μm or less when the DFR is used, and there is a problem with an ability to implement a pattern in a region of 10 μm.

Further, generally during a roll-to-roll exposure using a film mask, a lamination by means of A Roll and B Roll illustrated in FIG. 2 is introduced, and at this time, the step and uniformity of a patterned photosensitive resin during UV exposure are determined by the uniformity of gap between A Roll and B roll and the straightness of B Roll. At this time, a hard steel roll is typically applied to one of A Roll and B roll, the other roll is determined by characteristics of the resin and other process characteristics, and for example, an RTV Si roll is usually used. At this time, several mechanical defects which may occur during the contact of a roll and a roll are illustrated in FIG. 3. FIG. 3 illustrates an example in which mechanical defects occur when the axes of a rubber roll and a steel roll are brought into contact with each other with being twisted.

In addition, defects illustrated in FIG. 4 may occur according to a material and a shape of a rubber roll. Specifically, unlike an ideal contact shape in FIG. 4(A), as the position at which a load is applied is generally disposed at the edge of the roll, a deformation in which the center part is lifted occurs as illustrated in FIG. 4(B), or a phenomenon in which the center part becomes thick occurs. In order to solve the problem, there has been conducted an mechanical reinforcement for overcoming the problem by using a crown roll as illustrated in FIG. 4(C) or polishing the edge of the roll.

However, although the mechanical reinforcement is conducted, a local deformation of a roll basically occurs due to fluid characteristics of a photosensitive resin, and a step of a pattern for each position as illustrated in FIG. 5 is generated by the local deformation, and as a result, a stain is observed and visualized by the unaided eye.

CITATION LIST

Patent Document (Patent Document 1) Korean Patent Application Laid-Open No. 1992-0007912

DETAILED DESCRIPTION OF THE INVENTION

Technical Problem

The present application has been made in an effort to provide a film mask capable of reducing mura of a machine direction (MD) and a transverse direction (TD), which are traveling directions of a roll during a patterning using a photosensitive resin, which is a liquid or fluid, a method for manufacturing the same, and a method for forming a pattern using the film mask and a pattern formed thereby.

Technical Solution

An exemplary embodiment of the present application provides a film mask comprising:
a transparent substrate;
a darkened light-shielding pattern layer provided on the transparent substrate; and
an embossed pattern part provided on a surface of the transparent substrate, which is provided with the darkened light-shielding pattern layer.

According to another exemplary embodiment of the present application, the embossed pattern part comprises two or more embossed patterns formed at a predetermined gap.

According to still another exemplary embodiment of the present application, the embossed pattern part comprises two or more embossed patterns having the same thickness and formed at a predetermined gap.

According to yet another exemplary embodiment of the present application, the darkened light-shielding pattern layer preferably exhibits shielding characteristics in a UV region, and is not particularly limited as long as the darkened light-shielding pattern layer has a reflectance of about 30% or less in the UV region range, for example. According to an exemplary embodiment, the darkened light-shielding pattern layer may be composed of at least one of a black matrix material, a carbon black-based material, a resin mixed with a dye, and AlOxNy (0≤x≤1.5, 0≤y≤1, and x and y are a ratio of O atoms and N atoms to one Al atom, respectively).

According to another exemplary embodiment of the present application, the film mask may additionally comprise a metal layer between the transparent substrate and the darkened light-shielding pattern layer. The metal layer is, for example, an aluminum layer.

According to still another exemplary embodiment of the present application, a metal layer is provided between the transparent substrate and the darkened light-shielding pattern layer, the film mask comprises two or more regions of the metal layer where the thicknesses are different from each other or two or more regions of the darkened light-shielding pattern layer where the thicknesses are different from each other, or the film mask comprises a region where a metal layer is provided between the transparent substrate and the darkened light-shielding pattern layer and a region where the transparent substrate and the darkened light-shielding pattern layer are brought into direct contact with each other.

According to yet another exemplary embodiment of the present application, the film mask additionally comprises a surface protective layer provided on the darkened light-shielding pattern layer.

According to still yet another exemplary embodiment of the present application, the film mask additionally comprises a release force enhancement layer provided on the darkened light-shielding pattern layer and the embossed pattern part.

According to a further exemplary embodiment of the present application, the film mask further comprises an attachment layer provided between the darkened light-shielding pattern layer and the transparent substrate, or between the darkened light-shielding pattern layer and the embossed pattern part.

According to another further exemplary embodiment of the present application, the film mask comprises a metal layer provided between the darkened light-shielding pattern layer and the transparent substrate, and further comprises an attachment layer between the metal layer and the transparent substrate.

Still another further exemplary embodiment of the present application provides a method for manufacturing a film mask, the method comprising:

forming a darkened light-shielding pattern layer on a transparent substrate; and forming an embossed pattern part on a surface of the transparent substrate which is provided with the darkened light-shielding pattern layer.

Yet another further exemplary embodiment of the present application provides a method for forming a pattern by using the film mask according to the above-described exemplary embodiments.

Still yet another further exemplary embodiment of the present application provides a method for forming a pattern, the method comprising: applying pressure onto one surface of a laminate comprising two substrates, a photosensitive resin composition provided between the two substrates, and a sealing part which seals the two substrates so as for the photosensitive resin composition not to leak to the outside of the two substrates, such that the embossed pattern part of the film mask according to the above-described exemplary embodiments is brought into contact with the laminate;

exposing the laminate through the film mask; and developing an uncured resin composition in the two substrates.

A still further exemplary embodiment of the present application provides a pattern formed by using the film mask according to the above-described exemplary embodiments.

A yet still further exemplary embodiment of the present application provides a pattern structure comprising: a substrate; and a pattern provided on the substrate and formed by using a photosensitive resin composition, in which the pattern comprises a pattern loss portion provided at a predetermined gap.

Another exemplary embodiment of the present application provides a pattern structure comprising: two substrates; and a pattern formed between the two substrates by using a photosensitive resin composition, and having both ends each being brought into contact with the two substrates, in which length between the both ends of the pattern is uniform.

Advantageous Effects

A film mask according to exemplary embodiments described in the present application may reduce mura of a machine direction (MD) and a transverse direction (TD), which are traveling directions of a roll during a patterning using the roll, and may maintain an overall thickness uniformity under predetermined pressure conditions even when there is an mechanical defect due to a local deformation of a gap roll and a steel roll even when the film mask is applied to a roll-to-roll process, thereby forming a pattern having a uniform thickness.

BRIEF DESCRIPTION OF DRAWINGS

FIG. 1 is a photograph of a state of a pattern formed by using a DFR method in the related art.

FIG. 2 is a schematic view of an exposure process by means of a roll-to-roll process by using a film mask.

FIG. 3 exemplifies mechanical defects in a roll-to-roll process.

FIG. 4 exemplifies shape defects of a rubber roll.

FIG. 5 is a photograph illustrating a residual film problem when a pattern is formed by using a film mask in the related art.

FIG. 6 is a transmission perspective view of a film mask according to an exemplary embodiment of the present application.

FIG. 7 is a vertical cross-sectional view of the film mask according to an exemplary embodiment of the present application.

FIG. 8 is a vertical cross-sectional view of the film mask according to an exemplary embodiment of the present application.

FIG. 9 exemplifies a state observed from an upper surface of the film mask according to an exemplary embodiment of the present application.

FIG. 10 illustrates a photograph of a film mask manufactured according to an Example and the forms of a pattern manufactured by using the same.

FIG. 11 illustrates reflectance, transmittance, and absorbance of a material for a darkened light-shielding pattern layer according to an exemplary embodiment of the present application according to the wavelength.

BEST MODE

A film mask according to an exemplary embodiment of the present application is characterized by comprising: a transparent substrate; a darkened light-shielding pattern layer provided on the transparent substrate; and an embossed pattern part provided on a surface of the transparent substrate, which is provided with the darkened light-shielding pattern layer.

It is possible to solve mura of a machine direction (MD) and a transverse direction (TD), which are traveling directions of a roll occurring during a patterning using a photosensitive resin which is a liquid or fluid, by additionally forming an embossed pattern part on a film mask having a darkened light-shielding pattern layer. Further, even when it is difficult to adjust the thickness because there is an mechanical defect due to a local deformation of a gap roll and a steel roll, or a photosensitive resin composition, which is a liquid or fluid, is present between the rolls, an overall thickness uniformity may be maintained between the rolls under predetermined pressure conditions by the embossed pattern part, thereby forming a pattern having a uniform thickness.

According to another exemplary embodiment of the present application, the embossed pattern part comprises two or more embossed patterns formed at a predetermined gap. An overall thickness uniformity may be maintained between rolls by the embossed patterns disposed at a predetermined gap. If necessary, the embossed pattern part comprises two or more embossed patterns having the same thickness and formed at a predetermined gap.

FIGS. 6 and 7 exemplify a structure of a film mask having an embossed pattern part. The film mask of FIG. 7 additionally comprises an attachment layer, a metal layer, a surface protective layer, and a release force enhancement layer in addition to a darkened light-shielding pattern layer, but a portion of these layers may be omitted, if necessary.

When a pattern is formed by manufacturing a film mask having the structure illustrated in FIGS. 6 and 7, in case where a negative-type resin (UV-curing type) is used, an embossed pattern part may be disposed in a light-shielding region. The embossed pattern part serves to maintain a gap between a film mask and a material to be patterned during an exposure, and simultaneously, a region where the corresponding embossed pattern part and a darkened light-shielding pattern layer are overlapped with each other corresponds to a region where a development is performed after the exposure, and thus does not significantly affect an actual product. However, when a film mask comprising a darkened light-shielding pattern layer is manufactured, and then an embossed pattern part is additionally formed, unless a special alignment is performed, the embossed pattern part may be disposed at a portion which is not overlapped with a light-shielding region, so that the pattern may be lost.

In order to minimize the loss of the pattern, it is preferred to design a least common multiple which the periodicity of a darkened light-shielding pattern layer and the periodicity of an embossed pattern part constitute when a regular pattern is formed, as maximally as possible. As an example, if the periodicity (pitch) of a pattern of a darkened light-shielding pattern layer is 115 μm, when an embossed pattern part having a periodicity (pitch) corresponding to an integer multiple of 115 μm is introduced, the patterns of the embossed pattern part and the darkened light-shielding pattern layer are overlapped with each other. For example, when the position of the embossed pattern part is defined as a pitch such as 230, 345, 460, 575, 690, and 805, which are an integer multiple of 115 μm, the pattern is highly likely to be lost. Accordingly, in order to minimize the loss of the pattern, it is preferred to design the pitch of the pattern of the embossed pattern part as the pitch of the darkened light-shielding pattern layer, for example, (N+0.1) multiple to (N+0.9) multiple of 115 μm, for example, (N+0.5) multiple. Here, N is an integer.

As an example, when a darkened light-shielding pattern layer in a form for forming a dot pattern is formed on a film mask, a shape illustrated in FIG. 8 may be formed when an opening of the darkened light-shielding pattern layer, that is, a diameter in the form of a dot pattern where the darkened light-shielding pattern layer is not present is designed as 15 μm, the pitch of the dot pattern is designed as 115 μm, the diameter of a region of an embossed pattern part disposed thereon, where each pattern is brought into contact with a surface of the transparent substrate where the darkened light-shielding pattern layer is formed, is designed as 50 μm, and the pitch of the embossed pattern part is designed as 750 μm. In FIG. 8, it can be seen that a portion where a pattern is to be formed and an embossed pattern part are overlapped with each other as illustrated by a region indicated by a white circle.

In an exemplary embodiment, the darkened light-shielding pattern layer is not particularly limited as long as the pattern layer exhibits shielding characteristics of a UV region, and for example, a material having a reflectance of about 30% or less in a UV region range (100 nm to 400 nm) may be used. According to an exemplary embodiment, the darkened light-shielding pattern layer may be composed of at least one of a black matrix material, a carbon black-based material, a resin mixed with a dye, and AlOxNy ($0 \leq x \leq 1.5$, $0 \leq y \leq 1$, and x and y are a ratio of O atoms and N atoms to one Al atom, respectively). The range of x and y is preferably x>0, or y>0, or x>0 and y>0.

When the darkened light-shielding pattern layer is composed of AlOxNy, it is preferred that $0 < x \leq 1.5$ or $0 < y \leq 1$. When aluminum oxide, aluminum nitride, or aluminum oxynitride is used as the darkened light-shielding pattern layer, the darkened light-shielding pattern layer may alone exhibit semi-permeable characteristics and anti-reflection characteristics for the UV wavelength, so that according to the thickness of the darkened light-shielding pattern layer based on the characteristics, or by introducing a stacking structure with a metal layer based on these characteristics, the darkened light-shielding pattern layer may be applied to the manufacture of a half tone mask used for the purpose of a multilayer patterning.

The material and thickness of the darkened light-shielding pattern layer may be determined according to a size or a form of a material and a pattern to be patterned by using a film mask, and particularly, the thickness thereof may be determined according to the required UV light transmittance. For example, the darkened light-shielding pattern layer may have a thickness of 5 nm to 200 nm, and the thickness of the darkened light-shielding pattern layer is not limited as long as the thickness of the darkened light-shielding pattern layer is enough to shield light.

The darkened light-shielding pattern layer may have a pattern form of a pattern to be implemented by UV exposure as an opening region. For example, when a pattern with a cylindrical form or a dot form is intended to be formed, the darkened light-shielding pattern layer may have a pattern having circular openings. When the darkened light-shielding pattern layer is formed of the above-described AlOxNy, the size of the opening is easily formed with a desired size, and the darkened light-shielding pattern layer may have, for example, a circular opening having a diameter of 1 to 30 μm, or a linear opening having a line width of 1 to 30 μm. In particular, when the darkened light-shielding pattern layer is formed of the above-described AlOxNy, a high-resolution pattern with 15 μm or less may be formed, and a scan mura problem caused by the exposure method may be minimized.

In order to implement the pattern of the darkened light-shielding pattern, it is possible to apply various methods utilizing photolithography in addition to a direct exposure process using laser, which is typically used, or using a printing technique such as offset and inkjet.

The present inventors measured reflection and absorption wavelengths for the UV region (100 nm to 400 nm) with respect to a single layer and a stacking (AlOxNy/Al) structure of each of an Al layer and an Al-based oxynitride, and as a result, the present inventors confirmed that the stacking structure had a reflectance of about 30% or less for the UV region, and that the stacking structure could be used on the whole as a material for a mask by absorbing the other light (FIG. 11). In other words, the AlOxNy layer alone exhibits semi-permeable characteristics and anti-reflection characteristics for the UV wavelength, so that the present inventors confirmed that the AlOxNy layer could serve as an anti-reflection film in a mask structure in the related art.

The transparent substrate is not particularly limited as long as the transparent substrate has a light transmittance enough for an exposure process to be carried out by using the above-described film mask. The transparent substrate may be determined according to the size or material of a pattern to be patterned by using a film mask, and for example, it is preferred that a transparent substrate having a visible light transmittance of 50% or more is used. In order to use a roll when a pattern is formed by using a film mask, it is preferred that as the transparent substrate, a flexible substrate is used, and for example, a plastic film, specifically, a polyethylene terephthalate (PET) film may be used. The thickness of the transparent substrate is sufficient as long as the thickness may support a film mask, and is not particularly limited. For example, the transparent substrate may have a thickness of 10 nm to 1 mm, specifically, 10 µm to 500 µm.

The embossed pattern part may be composed of a resin known in the art, preferably a photosensitive resin. The thickness of the embossed pattern part or the size of each pattern brought into contact with the darkened light-shielding pattern layer may be determined, if necessary. For example, the thickness of the embossed pattern part may be determined at 100 nm to 1 mm, for example, 1 µm to 10 µm. For the size of each pattern of the embossed pattern part, which is brought into contact with the darkened light-shielding pattern layer, the diameter or longest length may be 1 µm to 100 µm. The form of each pattern of the embossed pattern part, which is brought into contact with the darkened light-shielding pattern layer, may be circular or polygonal, but is not particularly limited.

An exemplary embodiment may additionally comprise a metal layer between the transparent substrate and the darkened light-shielding pattern layer.

The metal layer may compensate light-shielding properties of the darkened light-shielding pattern layer, and may facilitate the formation or patterning of the darkened light-shielding pattern layer. As the metal layer, a material capable of compensating light-shielding properties, or a material which easily forms the darkened light-shielding pattern layer may be used. For example, aluminum (Al) may be used, and in this case, a darkened light-shielding pattern layer composed of aluminum oxide, aluminum nitride, or aluminum oxynitride is easily formed thereon. Further, it is easy for aluminum to be patterned simultaneously with a darkened light-shielding pattern layer composed of aluminum oxide, aluminum nitride, or aluminum oxynitride. The thickness of the metal layer may be determined in consideration of light-shielding properties, processability, or flexibility, and may be determined within, for example, 1 nm to 10 µm.

According to another exemplary embodiment of the present application, depending on durability, attaching characteristics, and the like of a material which serves to shield light in a film mask, an attachment layer may be additionally provided at the lower portion of the darkened light-shielding pattern layer, or a surface protective layer may be provided on the darkened light-shielding pattern layer, or it is possible to additionally introduce a release force enhancement layer provided on the darkened light-shielding pattern layer and the embossed pattern part.

The attachment layer may be provided between the darkened light-shielding pattern layer and the transparent substrate, or between the darkened light-shielding pattern layer and the embossed pattern part. Further, the attachment layer may be provided between the metal layer and the transparent substrate. As the attachment layer, it is possible to use an attachment layer which does not negatively affect a patterning using a film mask while reinforcing the attaching force between the transparent substrate or the embossed pattern part and the darkened light-shielding pattern layer or the metal layer. For example, an attachment layer material such as an acrylic, epoxy-based or urethane-based material may be used.

In the case of the surface protective layer, a urethane acrylate-based surface protective layer may be introduced as an example, but in the case of hardness at the HB level or higher, it was also confirmed that the material for the surface protective layer was not particularly limited. However, when a residual film and an increase in resolution of a product through a film mask, an increase in resolution, and the like are considered, it is preferred that a layer which has a larger refractive index than that of a substrate or an attachment layer and does not absorb UV light is used as a surface protective layer, if possible.

Thereafter, in the case of a release force enhancement layer corresponding to an outermost layer, it was confirmed that a layer in a form comprising a fluorine-based material, a silicone-based material, or a mixture thereof could be introduced, and when the layer was introduced, a layer having a thickness of 100 nm or less was preferred. For example, the release force enhancement layer may be formed to have a thickness of 1 nm to 100 nm. Examples of a method for forming the corresponding layer comprise a wet coating method and a vapor deposition method, and the vapor deposition method is more advantageous.

Furthermore, according to the process by a user, a film mask manufactured for the purpose of increasing a thickness may be reinforced and used through an additional substrate and an additional bonding layer. The release force enhancement layer is effective for general releasing processes and molding processes when the release force enhancement layer has surface energy, for example, 30 dynes/cm or less which is equal to or less than that of a substrate to be patterned, for example, a plastic film such PET, an ITO film, and the like. As the release force enhancement layer, a release force enhancement layer having surface energy of preferably 22 dynes/cm or less, and more preferably 15 dynes/cm or less may exhibit a good performance. The lower the surface energy of the release force enhancement layer is, the better the release force enhancement layer is, and the surface energy may be more than 0 dynes/cm and 30 dynes/cm or less.

A material for the release force enhancement layer is not particularly limited as long as the material has the surface energy, and a fluorine-based material, a silicone-based material, or a mixture thereof may be used. As a specific example, it is possible to use a fluorine-based material having a perfluoroether chain, a silicone-based material having an alkoxy silane or silanol, or a mixture thereof. The silicone-based material such as the alkoxy silane or silanol may improve attaching properties to other substrates. Additionally, the release force enhancement layer may additionally comprise a $SiO_2$ layer or a $TiO_2$ layer in order to reinforce the durability of the release force enhancement layer. For example, when a $SiO_2$ layer or a $TiO_2$ layer is first deposited, and then a layer comprising a silanol is formed, —OH of the silanol is subjected to a dehydration condensation reaction at room temperature, and thus may induce the layer comprising the silanol to be completely bonded to a surface of a layer which is brought into contact with the layer comprising the silanol.

According to still another exemplary embodiment of the present application, a metal layer provided between the transparent substrate and the darkened light-shielding pattern layer is provided, the film mask comprises two or more regions of the metal layer where the thicknesses are different from each other or two or more regions of the darkened light-shielding pattern layer where the thicknesses are different from each other, or the film mask comprises a region where a metal layer is provided between the transparent substrate and the darkened light-shielding pattern layer and a region where the transparent substrate and the darkened light-shielding pattern layer are brought into direct contact with each other. FIG. 8 exemplifies a structure of a film mask comprising a region which is provided with a metal layer and a region which is not provided with a metal layer. Depending on the thickness of a metal layer or a darkened light-shielding pattern layer or the presence or absence of a metal layer, a portion having a different light transmittance is created in a film mask, thereby manufacturing a half tone region. In FIG. 8, a thickness of a pattern formed by a half tone region, in which a darkened light-shielding pattern layer which transmits only a portion of the UV light is present, is formed to be thinner than the thickness of a pattern formed by a general mask region which does not have a darkened light-shielding pattern and a metal layer.

Yet another exemplary embodiment of the present application provides a method for manufacturing a film mask, the method comprising:

forming a darkened light-shielding pattern layer on a transparent substrate; and forming an embossed pattern part on a surface of the transparent substrate, which is provided with the darkened light-shielding pattern layer.

The forming of the darkened light-shielding pattern layer may be carried out by forming a darkened light-shielding layer using a material for forming a darkened light-shielding pattern layer on a transparent substrate, and then performing photoresist (PR) coating, UV exposure, development, etching, and stripping processes. The step may be subjected to an inspection and repair process, if necessary.

The forming of the embossed pattern part may be carried out by a process of coating a bonding resin and performing UV exposure, and then coating a resin composition for forming an embossed pattern part and performing UV exposure. The step may be subjected to an inspection and repair process, if necessary. A layer formed by coating the bonding resin and performing UV exposure may correspond to the above-described attachment layer.

Still yet another exemplary embodiment of the present application provides a method for forming a pattern by using the film mask according to the above-described exemplary embodiments. An example provides a method for forming a pattern, the method comprising: applying pressure onto one surface of a laminate comprising two substrates, a photosensitive resin composition provided between the two substrates, and a sealing part which seals the two substrates so as for the photosensitive resin composition not to leak to the outside of the two substrates, such that the embossed pattern part of the film mask according to the above-described exemplary embodiments is brought into contact with the laminate; exposing the laminate through the film mask; and developing an uncured resin composition in the two substrates.

A further exemplary embodiment of the present application provides a pattern formed by using the film mask according to the above-described exemplary embodiments.

Another further exemplary embodiment of the present application relates to a pattern structure comprising: a substrate; and a pattern provided on the substrate and formed by using a photosensitive resin composition, in which the pattern comprises a pattern loss portion provided at a predetermined gap. An additional substrate may be provided on a surface of the substrate, which is provided with the pattern. That is, the pattern may be provided between two substrates.

Still another exemplary embodiment of the present application relates to a pattern structure comprising: two substrates; and a pattern formed between the two substrates by using a photosensitive resin composition, and having both ends each being brought into contact with the two substrates, in which a length between the both ends of the pattern is uniform. Here, the length between the both ends of the pattern is an expression corresponding to the thickness of the pattern in the aforementioned description. The two substrates are not particularly limited as long as the two substrates have flexibility, and for example, a plastic film, specifically, a PET film may be used.

MODE FOR INVENTION

Hereinafter, the present invention will be described in more detail through Examples. However, the following Examples are only for exemplifying the present invention, and are not intended to limit the present invention.

Example 1

An attachment layer was formed on a PET substrate having a thickness of 250 μm by using a urethane-based material, a plasma pre-treatment was carried out, and then an Al layer having a thickness of 100 nm was formed by a sputtering method. An AlOxNy layer ($x>0$ and $0.3 \leq y \leq 1$) was formed by means of reactive sputtering by adding nitrogen, which is a reactive gas, onto the Al layer. Subsequently, a positive-type photoresist (manufactured by DongJin Semichem Co., Ltd., N200) was coated and fixed on a stage, and UV exposure was performed by using a UV laser with a wavelength of 365 nm. Subsequently, a photoresist pattern was formed by performing a development using a 1.38% TMAH solution. By means of the photoresist pattern, the Al layer and the AlOxNy layer were etched by using an acid solution, and stripped by using a peeling solution (LG Chem., LG202) to form a pattern. At this time, an opening of the AlOxNy layer was designed, such that a dot pattern having a diameter of 15 μm had a pitch of 115 μm.

Subsequently, a bonding layer was coated onto the AlOxNy layer, and a resin composition for forming an embossed pattern part (UV-curable urethane acrylate resin) was applied thereon, and then imprinted by using a glass cliché having an etching depth of 7.5 μm as a master mold to form an embossed pattern part. At this time, a release force with the embossed pattern part after imprinting and UV-curing was maximized by subjecting the cliché to a gas phase Si-based release treatment, and a film mask having a produced embossed pattern part was induced to easily remove residues produced during the process through the release treatment.

The UV-curable urethane acrylate resin was patterned by using the film mask as described above.

FIG. 10 illustrates an example of the pattern loss according to the overlapping of an opening of a darkened light-shielding pattern layer and an embossed pattern part in a pattern formed by using the film mask manufactured as described above. FIG. 9(A) is a shape of a film mask having an embossed pattern part, and FIG. 9(B) is a photograph illustrating a pattern formed by using the film mask.

Bright circles in a region corresponding to FIG. 10(A) indicate dots which are openings of a darkened light-shielding pattern layer present in a film mask, and a circle with a black contour line shows an embossed pattern part. As a result of measuring the step, it could be confirmed that a step sized 7.3 μm is formed equally at only a portion corresponding to an embossed pattern part region.

As a result of observing the shape of a dot pattern formed after the roll-to-roll exposure and development are performed by using a process illustrated in FIG. 2 using a film mask having an embossed pattern part, a pattern illustrated in FIG. 10(B) was obtained. According to FIG. 10(B), the dot pattern in a portion corresponding to the region of the embossed pattern part was lost, it is assumed that the loss is caused by a slip phenomenon occurring between the films during a roll-to-roll process using a film mask and a film substrate to be patterned, and it is determined that the dimension in which the slip occurs is at a level of about 100 μm. Furthermore, as a result of measuring the steps of the neighboring dot patterns, it could be confirmed that all the steps were formed at around 7.3 μm, which is the same as the size of the step of the embossed pattern part.

In order to more macroscopically confirm the uniformity of the step described above, a liquid crystal cell was manufactured by using a substrate in which a dot spacer was formed on one surface and a general plane substrate on one surface.

At this time, a dot spacer film was manufactured by filling a UV resin between the substrates using a mask film having an embossed gap pattern formed, and then exposing the UV resin. At this time, as the substrate film, an ITO film was used, and the mask film having an embossed gap pattern formed was manufactured in the same manner as described above.

A solution in which a dye was mixed with a resin was applied onto the film, the film was laminated through a PET film, the height uniformity for 9 point positions within 55 inches was observed, and the results are shown in the following Table 1.

TABLE 1

|  | Left | Center | Right |
|---|---|---|---|
| Size (μm) | 15.3 | 15.9 | 16.2 |
|  | 17.1 | 16.5 | 15.7 |
|  | 17.2 | 16.4 | 15.7 |
| Thickness (μm) | 5.1 | 5.1 | 5.3 |
|  | 5.0 | 5.4 | 5.3 |
|  | 5.1 | 5.2 | 5.3 |

In Table 1, the size means a diameter of a portion exposed through a circular (dot) pattern (opening) of a film mask. When the gap of the circular pattern is not uniform, the pattern in the form of a cone is formed, and as a result, the uniformity of the size deteriorates.

Comparative Example 1

An experiment was performed in the same manner as in Example 1, except that the embossed pattern part was not formed. Like Example 1, a dot spacer film having a dot pattern formed as a spacer between two substrates was manufactured by the dot pattern manufactured by using the manufactured film mask. A solution in which a dye was mixed with a resin was applied onto the film, the film was laminated through a PET film, the height uniformity for 9 point positions within 55 inches was observed, and the results are shown in the following Table 2.

TABLE 2

|  | Left | Center | Right |
|---|---|---|---|
| Size (μm) | 13.8 | 15.5 | 14.7 |
|  | 15.6 | 15.8 | 15.2 |
|  | 15.6 | 14.9 | 14.7 |
| Thickness (μm) | 9.2 | 10.6 | 8.0 |
|  | 7.8 | 7.2 | 10.4 |
|  | 8.4 | 9.1 | 7.5 |

It could be confirmed that the thickness uniformity in Example 1 was excellent as compared to the thickness uniformity at the 9 points positions obtained in Comparative Example 1.

According to the results in Tables 1 and 2, it can be confirmed that in the case of a mask in which an embossed pattern part is not formed, the gap between the films is not uniform during the exposure, and as a result, the deviations of the size and the height occurring after the pattern present in the film mask is exposed are significant, whereas in the case of a mask in which an embossed pattern part (gap spacer) is present, the uniformity is secured.

The invention claimed is:

1. A film mask comprising:
    a transparent substrate that is a plastic film;
    a darkened light-shielding pattern layer;
    a metal layer provided between the transparent substrate and the darkened light-shielding pattern layer;
    an attachment layer comprising an acrylic material, an epoxy-based material, or a urethane-based material provided between the metal layer and the transparent substrate; and
    an embossed pattern layer provided on a surface of the transparent substrate bearing the metal layer and the darkened light-shielding pattern layer,
    wherein the metal layer comprises aluminum, and the darkened light-shielding pattern layer comprises aluminum oxynitride.

2. The film mask of claim 1, wherein the embossed pattern layer comprises two or more embossed patterns formed at a predetermined gap.

3. The film mask of claim 1, wherein the embossed pattern layer comprises two or more embossed patterns having the same thickness and formed at a predetermined gap.

4. The film mask of claim 1, wherein the darkened light-shielding pattern layer has a reflectance of about 30% or less in a UV region.

5. The film mask of claim 1, wherein the film mask comprises two or more regions of the metal layer where the thicknesses are different from each other or two or more regions of the darkened light-shielding pattern layer where the thicknesses are different from each other, or the film mask comprises a region where the metal layer is provided between the transparent substrate and the darkened light-shielding pattern layer and a region where the transparent substrate and the darkened light-shielding pattern layer are brought into direct contact with each other.

6. The film mask of claim 1, further comprising:
a surface protective layer provided on the darkened light-shielding pattern layer.

7. The film mask of claim 1, further comprising:
a release force enhancement layer provided on the darkened light-shielding pattern layer and the embossed pattern layer.

8. A method for manufacturing the film mask according to claim 1, the method comprising:
forming the attachment layer comprising an acrylic, an epoxy-based material, or a urethane-based material on the transparent substrate;
laminating the metal layer and the darkened light-shielding pattern layer on the attachment layer to make the metal layer provided between the transparent substrate and the darkened light-shielding pattern layer; and
forming an embossed pattern layer on a surface of the transparent substrate bearing the metal layer and the darkened light-shielding pattern layer,
wherein the metal layer comprises aluminum, and the darkened light-shielding pattern layer comprises aluminum oxynitride.

9. The method of claim 8, wherein the forming of the darkened light-shielding pattern layer is carried out by forming a darkened light-shielding layer using a material for forming a darkened light-shielding pattern layer on a transparent substrate, and then performing photoresist (PR) coating, UV exposure, development, etching, and stripping processes.

10. The method of claim 8, wherein the forming of the embossed pattern layer is carried out by a process of coating a bonding resin and performing UV exposure, and then coating a resin composition for forming an embossed pattern layer and performing UV exposure.

11. A method for forming a pattern, comprising:
applying pressure onto one surface of a laminate comprising:
a first substrate;
a second substrate;
a photosensitive resin composition provided between the first substrate and the second substrate; and
a sealing part that seals the first substrate and second substrate together so that the photosensitive resin composition therebetween does not leak to the outside from the first substrate and the second substrate,
such that the embossed pattern layer of the film mask of claim 1 is brought into contact with the laminate;
exposing the laminate through the film mask; and
developing an uncured resin composition in the two substrates.

* * * * *